(12) United States Patent
Campos Canton et al.

(10) Patent No.: US 9,793,897 B1
(45) Date of Patent: Oct. 17, 2017

(54) METHOD AND CIRCUIT FOR INTEGRATING A PROGRAMMABLE MATRIX IN THE FIELD OF RECONFIGURABLE LOGIC GATES EMPLOYING A NON-LINEAL SYSTEM AND AN EFFICIENT PROGRAMMABLE REWIRING

(71) Applicant: Instituto Potosino de Investigación Científica y Tecnológica A.C., San Luis Potosí (MX)

(72) Inventors: Eric Campos Canton, San Luis Potosí (MX); Moises Garcia Martinez, San Luis Potosí (MX); Roberto Rafael Rivera Duron, San Luis Potosí (MX)

( * ) Notice: Subject to any disclaimer, the term of this patent is extended or adjusted under 35 U.S.C. 154(b) by 0 days.

(21) Appl. No.: 15/251,444

(22) Filed: Aug. 30, 2016

(51) Int. Cl.
*H03K 19/173* (2006.01)
*G06F 7/38* (2006.01)
*H03K 19/177* (2006.01)

(52) U.S. Cl.
CPC ..... *H03K 19/1736* (2013.01); *H03K 19/1737* (2013.01); *H03K 19/17708* (2013.01)

(58) Field of Classification Search
None
See application file for complete search history.

(56) References Cited

U.S. PATENT DOCUMENTS

| 5,280,202 A * | 1/1994 | Chan ................. H03K 19/1737 326/37 |
| 2006/0033528 A1* | 2/2006 | Wang ................. H03K 19/1736 326/41 |

* cited by examiner

*Primary Examiner* — Anh Tran
(74) *Attorney, Agent, or Firm* — Defillo & Associates, Inc.; Evelyn A. Defillo

(57) ABSTRACT

The present invention relates to the field of reconfigurable computing also known as dynamic computing and, more particularly, to reconfigurable architectures logic gates and programmable wiring connections between them and the input interfaces and output interfaces. There is growing interest in developing new hardware architectures to complement or replace existing static architectures, and recently, there has been a theoretical direction to explore the richness of nonlinear dynamical systems to implement reconfigurable hardware (dynamic). The present invention is to use a nonlinear to emulate different logic gates dynamic system that are the basis of general-purpose computing, and after obtaining the logic gates, integrate these elements into a programmable device by the user, ie for create a field programmable array of reconfigurable logic gates.

9 Claims, 5 Drawing Sheets

METHOD AND CIRCUIT FOR INTEGRATING A PROGRAMMABLE MATRIX IN THE FIELD OF RECONFIGURABLE LOGIC GATES EMPLOYING A NON-LINEAL SYSTEM AND AN EFFICIENT PROGRAMMABLE REWIRING

FIELD OF THE INVENTION

An Field Programmable Reconfigurable Gate Array (FPRGA) is a programmable device containing logic blocks whose functionality and interconnection can be configured in situ by a specialized description language; which conventionally it consists of four main blocks: reconfigurable logic gates, programmable interconnects, input interfaces and output interfaces. The configuration of the FPRGA logic gates, is a nonlinear system and can be configured to perform any of the following logic functions: AND, OR, XOR, NAND, NOR y NOT.

The present invention relates to the field of reconfigurable computing also known as dynamic computing, more particularly to reconfigurable architectures logic gates, programmable wiring connections between them, and input interfaces and output interfaces.

BACKGROUND OF THE INVENTION

There is growing interest in developing new hardware architectures to complement or replace existing static architectures, and recently there has been a theoretical direction to explore the richness of nonlinear dynamical systems to implement reconfigurable hardware (dynamic).

The present invention is to use a nonlinear dynamic system to emulate different logic gates, which are the basis for general-purpose computing, and after obtaining the logic gates, integrate these elements into a programmable device by the user, ie for create a dynamic array of logic gates. In the prior art there are some related technology developments such as the following:

U.S. Pat. No. 5,646,546A (U.S. Pat. No. 5,748,009A) consisting of a programmable logic cell generated by four logic gates, where two of which are configurable. The two configurable logic gates are located near the entrances of the logic cell. Each configurable logic gate has two inputs, each input is connected to one of the four inputs of the logic cell. The two remaining logic gates receive the outputs of the configurable logic gates. There are four independent input nodes, each of which has an associated programmable input multiplexer. Each input multiplexer could have inputs connected to at least two types of interconnecting conductors. The cell also has two output lines, each has an associated output multiplexer that controls the cell independently. The output of each output multiplexer is connected to an input of output multiplexer. Additional features include a multiplexer having inputs connected to two input nodes of the cell, an input selector connected to a third input node of the logic cell, and an output connected to an output node of the cell; a data system with low input distortion (eg clock) that has at least one input multiplexers; a flip-flop connected in the logic cell; and the internal feedback of the cell. The preferred programming method uses SRAM memory cells programmed by the user.

In the patent described above, the logic gates that are interconnected are programmable only through interconnection, so fail to set a dynamic array, where each perform multiple functions type AND, OR, XOR, NAND, NOR and NOT interchangeably, so they are fixed operations or configured by the initial pulse input to the cell.

A second patent relating to this technology is the U.S. RE35977E, consisting of a set of lookup tables for use in programmable logic devices modified to facilitate the use of such tables to provide adders (subtractors including) and various types of counters. Each lookup table is actually divided into smaller query tables when an adder or counter is required. A portion of the partitioned table is used to provide a sum output signal, while the other part of the partitioned table is used to provide a signal that can be applied immediately in the next stage of the adder or counter. If desired, each logic module includes a lookup table may further include logic circuitry for logically combining its normal output applied to its carry in input signal to provide a range of functions that have more inputs and may be accepted by a single logic module.

Unlike the technology proposed, arrangements do not require partitions to differentiate sectors of the tables, as in this patent differentiate the type of function that feed instructions; but it is based on a nonlinear system with any features that feeds.

A similar proposed arrangement is contained in U.S. Pat. No. 6,025,735A patent, such an arrangement is based on a matrix of programmable switching comprised of a series of elements arranged in rows and columns, in which a first, a second, and a third programmable switching element in the array of programmable switching elements include: a ferroelectric transistor having a control electrode, a first conduction terminal and a second conducting terminal, wherein the ferroelectric transistor provides a conduction path for transferring a signal through programmable switching element; a transistor programming having coupled a control electrode to receive a selection signal, a first current conduction electrode, and a second current conduction electrode coupled to receive a programming voltage to program the ferroelectric transistor either in a on or off state, the first programming transistor's driving current electrode is coupled to the control electrode of the ferroelectric transistor; and a first line programming, which provides the programming voltage coupled to the second programming transistor's driving current electrode in the first and third programmable switching element in the array of programmable switching elements; and a first selection line which supplies the selection signal coupled to the control electrode of the transistor programming in the first and second programmable switching elements in the matrix. This patent is practically focused on the wiring between logic gates.

Now, with respect to similar methods or processes, US20050073337A1 (U.S. Pat. No. 7,096,437B2, U.S. Pat. No. 7,415,683B2, U.S. Pat. No. 8,091,062B2), this patent comprises a dynamically configurable logic gate may include a controller configured to provide a reference threshold signal resulting in the first signal; an adder configured to sum the first reference threshold signal and at least one input signal to generate a summed signal; a chaotic updater configured to apply a nonlinear function to the summed signal; and a subtractor configured to determine an output signal by taking a difference between a second threshold reference signal and the summed signal processed in the chaotic updater. The logic gate can function as one of a plurality of different logic gates responsive to adjusting at least one of the reference threshold signals.

However, this instruction set obtains its technical feature in the corresponding programmed difference, which depends directly on the type of chaotic nonlinear system used.

US20110062986A1 patent, U.S. Pat. No. 7,973,566B2, US20100219858A1, U.S. Pat. No. 7,863,937B2 includes a set of elements that complements and becomes more complex the above patent, since an input of the logic gate receives at least one signal input logic gate and at least one control signal. At least one outlet to produce each output signal of the logic gate. A nonlinear updater works as a dynamically configurable element to produce a plurality of different logic gates selected by the control signal. Nonlinear updater includes a nonlinear output updater. Nonlinear updater is configured to apply a nonlinear function to the input signal of the logic gate to produce the output signal of the nonlinear updater that represents a logical expression being implemented by one of the plurality of different logic gates in input signal of the logic gate; A comparator includes a comparator input which is adapted to receive a threshold value of reference for producing the output signal of the logic gate based on comparing the nonlinear output signal with the reference threshold value.

The patent US20100219862 is a logic gate which is adapted to implement logical expressions. The logic gate includes at least one inlet which is adapted to receive an input signal and at least one control signal. At least one input signal and the control signal is a noise signal. At least one outlet is adapted to produce an output signal. Nonlinear updater works as a dynamically configurable element and produces multiple different logic gates selected by the control signal based at least in part on the noise signal. The nonlinear updater is electrically coupled to the input and is also electrically coupled to the output. Nonlinear updater is configured to apply a nonlinear function to the input signal in response to the control signal to produce the output signal representing a logical expression being implemented by one of several different logic gates in the input signal. This patent is related to chaotic computing, operation includes noise signals. Although the mechanism is described similarly technical feature is to be completely different, since the programmable nonlinear chaotic system that selects the output depends directly on this.

Patents US2008150578A1, US2011006807A1, U.S. Pat. No. 7,925,814 comprise a configurable logic gate that uses a nonlinear element. The dynamically configurable logic gate includes an input adder to receive a pair of input signals and generating the sum of said input signals input. In addition, the dynamically configurable logic gate includes a nonlinear element applying a nonlinear function to the sum of the input signals to produce a nonlinear output signal. The output signal of the dynamically reconfigurable logic gate corresponds to one of the different logic gates responsive to adjusting the sum of the input signals and/or the nonlinear function. The patent includes the dynamically configurable logic gate having feedback to one of the inputs. The dynamically configurable logic gate receives the two inputs and functions as one of different types of logic gates to produce an output signal corresponding to a memory element according to a selection control signal. It also discloses a matrix structure of dynamically configurable logic elements. This patent makes use of a nonlinear and chaotic system.

Patent US2008094103A1 in general protects the functionality of a multiplexer having m input ports only and performs the function of a multiplexer which has twice the predetermined input signals A1, A2, . . . , Aj, where j=2*m. The multiplexer functionality can be implemented using programmable device having one or more macrocells, an inverter and switches as antifuses. This patent relates to programmable logic modules and more specifically with the functionality of the multiplexers.

The patent US2008273831 consists of an optical logic gate which comprises two optical inputs for receiving two optical signals and an optical output that produces an optical signal, this signal represents the result of applying a logic function required. The logic gate is characterized by optical combinatorial means for mixing the optical signals and thus produce a corresponding combinatorial signal whose strength is the combination of the powers of the optical signals and non-linear optical means receiving the combined signal and output the optical signal departure. The logic function depends on the characteristic of nonlinear optical media. This patent relates to optical logic gates which are reconfigurable in terms of the logic function.

US2013002293 shows a dynamically reconfigurable logic gate with linear base, which is a device that allows logical outputs dependent configurable parameters set within the device. The device consists of three blocks: the first block receives at least one input signal and determines whether the signals are "high" or "low" compared with a reference threshold signal. The second block adds the logical signals of the first block with an offset signal. The third block determines if the sum at the second block is a low or high level by checking if the sum falls within a predetermined range. This patent is related to the dynamic computation and particularly to dynamically configurable logic gates structures with linear kernel.

The novelty of the proposed invention consists of a programmable array within the field of reconfigurable logic gates (FPRGA type) consisting of a device to implement complex logic functions. The design of a FPRGA is based on four main blocks: the reconfigurable logic gates, programmable rewiring, input interfaces and output interfaces. Each reconfigurable logic gate is a nonlinear system and can be configured to perform any of the following logic functions: AND, OR, XOR, NAND, NOR and NOT; programmable rewiring allows communication between other blocks of reconfigurable logic gates, and with the input and output interfaces; while input and output interfaces respectively serve to communicate signals from outside the device and vice versa. Current research exploits the characteristics of nonlinear dynamic systems through their electronic implementations, for example, those described in the patents or their respective publications identified as U.S. Pat. No. 8,091,062, U.S. Pat. No. 7,973,566, U.S. Pat. No. 7,924,059, U.S. Pat. No. 7,863,937, U.S. Pat. No. 7,415,683, U.S. Pat. No. 7,096,437, U.S. Pat. No. 7,453,285, U.S. Pat. No. 7,925,814 and the invention contained in the patent application US 2010/0219858 that are related to chaotic computing architectures for logic gates based on nonlinear systems; however, in the present invention are disclosed settable structures dynamically reconfigurable logic gates based on a nonlinear system without sensitivity to initial conditions, programmable interconnects, as well as blocks of input and output blocks. On the other hand, there are inventions and patents comprising modules which can be rewired to produce different outputs calculation, but these devices employ static logic gates.

Examples of this type of technology, field programmable gate arrays (FPGAs) where it is possible to reconfigure the arrangement by rewiring. This produces a limited flexibility in reconfiguring degree rewiring only and not reconfiguration of logic gates. Patents described in U.S. Pat. No. 6,025,735A, U.S. Pat. No. 5,646,546 and RE35977E, based on arrangements where static logic gates rewiring may have significant difference of configurable structures reconfigurable logic gates based on a nonlinear system presented in this application. FPGAs rewiring is based on different embodiments, for example the U.S. Pat. No. 7,482,834B2 has a programmable multiplexer, which allows rewiring.

Although the basis of these structures is a nonlinear system in this proposed structures have sensitive dependence on initial conditions, as does the chaotic circuit for a robust dynamic reconfigurable logic gate; therefore, a method, a circuit, a matrix, and the system to provide an implementation of a reconfigurable logic element using nonlinear system and an effective programmable rewiring between them were designed.

SUMMARY OF THE INVENTION

The characteristic details of this novel reconfigurable logic gates matrix that employs a nonlinear system and an effective programmable rewiring, which includes the circuit and the method that are integrated, are clearly shown in the following description and the accompanying figures, and a description of that where the same reference signs continue to indicate the parts and figures shown.

Figure 4:
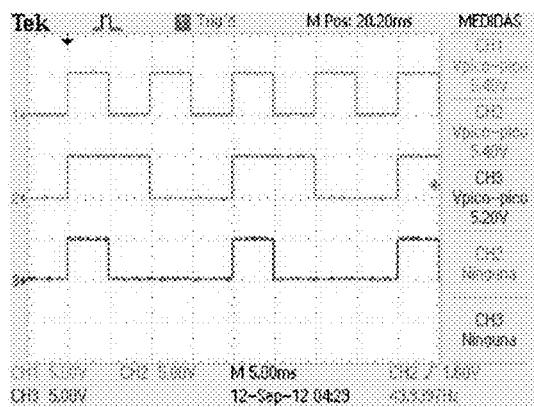
FIG. 4 is the experimental response of a reconfigurable logic gate taking the logical AND within the matrix of reconfigurable logic gates which employs a nonlinear system and an effective programmable rewiring. The upper trace represents the input signal $x_1$. The middle line represents the input signal $x_2$. The bottom line represents the output.

Based on the above figures, the matrix of reconfigurable logic gates that employs a nonlinear system and an efficient programmable rewiring comprises a set of reconfigurable logic gates with reconfigurable interconnections between them and with external signals. That is, this matrix allows a double programming generally described as:

First Programming:

Cada compuerta lógica reconfigurable se puede programar para implementar varias operaciones lógicas después de que un parámetro de control se ha establecido. El diseño de cada compuerta lógica reconfigurable comprende tres bloques:

a) an input block of reprogrammable logic gate,
 b) an adder block accompanied by a compensation signal (defined as control signal) to determine the behavior of the reconfigurable logic gate.
 c) a output window detector block with a threshold reference signal defining the logical level at the output.

Where the input block of the reconfigurable logic gate has a pair of comparators that determine whether the input voltages are signal "high" or signal "low", ie, determine whether it is logic one or a logic zero, respectively;

Said first summing block sums the output signals from the input block and a voltage compensation and then inverts that sum. Said detector block output window determines whether the output of adder block falls in a range defined by a voltage set by the user, generating a "high" level when the signal received from adder block is in the range; by setting a compensation voltage (control signal) can be obtained from the following logical operations:

An AND gate (see FIG. 4);
 An OR gate (see FIG. 5);
 An XOR gate (see FIG. 6);
 A NAND gate (See FIG. 7);
 A NOR gate (see FIG. 8);
 A NOT gate.

Second Programming:

The complete set of reconfigurable logic gates described above can be configured to interconnect the reconfigurable logic gates with each other, or to the input and output blocks. This process of rewiring programmable provides the ability to implement complex logic function and allows the user to interact with external signals. This allows different functions such as:

a) acquire data from the array of reconfigurable logic gates;
 b) introducing a signal from a function generator.

OBSERVATION. In order to clearly present the elements of this application; examples are only declarative more Nonlimiting be described, since both conducting and operation of the invention, are achievable in different ways and, since the structural details should be interpreted as the justification for the technical effects obtained to support the claims so which they are merely representative of the technical feature and novel implications comprising.

The matrix consists of reconfigurable logic gates (each can be programmed to perform logic functions: AND, OR, NAND, NOR, XOR o NOT); a block of reconfigurable rewiring; a block of input interface; a block output interface;

the latter two are used to communicate the device with external devices and vice versa, so that may be considered conventional.

Figure 1:
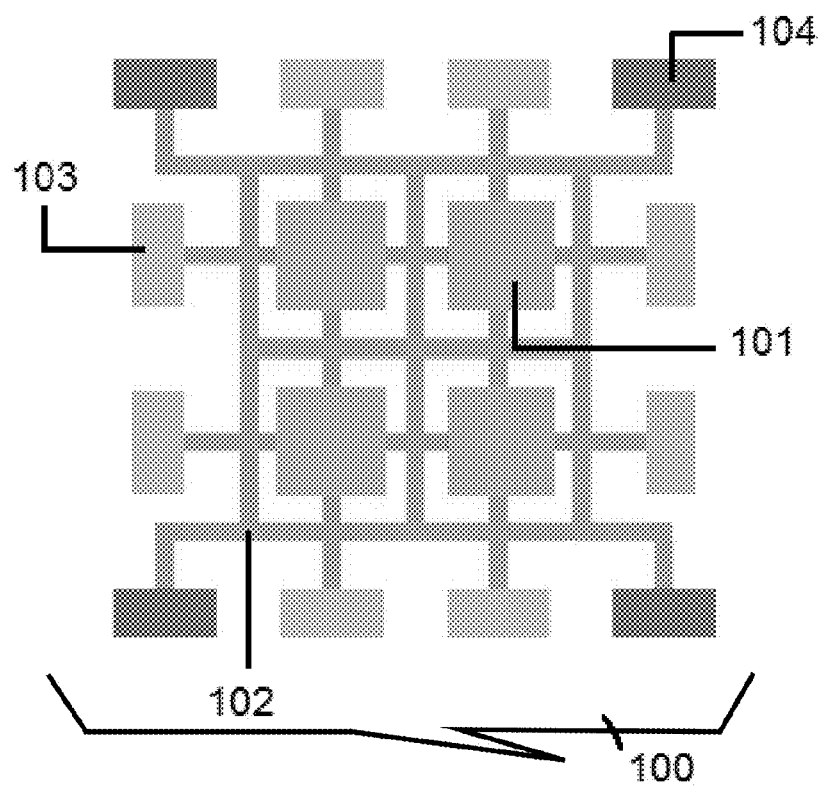
FIG. 1 is a diagram of the architecture of the reconfigurable logic gate array employing a nonlinear system and an effective programmable rewiring.

As shown in FIG. 1, this general representation is a block diagram showing the architecture of the programmable array field of reconfigurable logic gates 100, wherein the matrix comprises at least two reconfigurable logic gates 101 (this first embodiment comprises four, arranged in arrays of two rows by two columns) connected to each other using a programmable rewiring 102 which directs the outputs frame reconfigurable logic gates 101, to at least one input interface block 103 to a block or output interface 104. The input block 103 and outlet block 104 are preferably placed on the periphery of the array 100.

Now in a first approach to the operation of the array 100, it uses a circuit for the logic gate reconfigurable 101 (see FIG. 2) which consists of three blocks: a first identified as input block 200 of the logic gate block reconfigurable 101, a second adder block called block 216, and a third block called output window detector block 217. the input block 200, has at least two input signals 203 and 205 entering the reconfigurable logic gate 101; also it has two comparators 201 and 202 in order to receive two logic signals through inputs 203 and 205, respectively; once you received the latter a decision tree starts where:
  a) If the input signal 203 is greater than the reference voltage 204, then the output signal 208 of comparator 201 is set to the voltage 206;
  b) If the input signal 203 is less than the reference voltage 204, then the output signal 208 obtained is zero volts;
  c) If the input signal 205 is greater than the reference voltage 204, then the output signal 209 of comparator 202 is set to the voltage 207;
  d) If the input signal 205 is less than the reference voltage 204, then the output signal 209 obtained is zero volts;

Now the summing block 216 receives signals 208 and 209 output of the comparator blocks 201 and 202 respectively in one of its inputs and a third, the compensation signal 211 is received; This compensation signal is the control parameter allows you to program the logic operation of the reconfigurable logic gate 101, ie, it is possible to obtain different logical operations only by adjusting the control parameter (see FIG. 4 to FIG. 8). The output of summing block 212 is the result of adding the respective signals 208, 209 and 211. This sum is performed by the adder 210 in the summing block 216. Finally, the third block, identified as output window detector 217, It comprises a comparator 213 which defines a logical level at the output 215 as follows:
  a) if the absolute value of the sum obtained by the adder block 216 represented by the output signal 212 is less than the reference 214, of the window detector block 217; then a "high" logic level is obtained at the output 215;
  b) if the absolute value of the sum obtained by the adder block 216 represented by the output signal 212 is above the reference 214, of the window detector block 217; then a logic "low" is obtained at the output 215;

EXAMPLE 1

Figure 2:
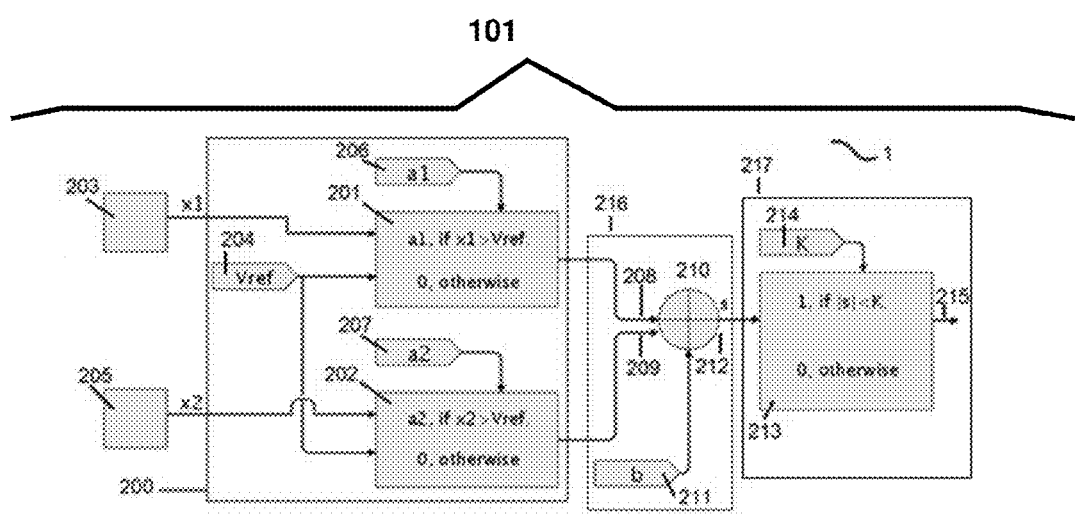
FIG. 2 is a block diagram of a reconfigurable logic gate within the matrix of reconfigurable logic gates which employs a nonlinear system and an effective programmable rewiring.
Figure 3:
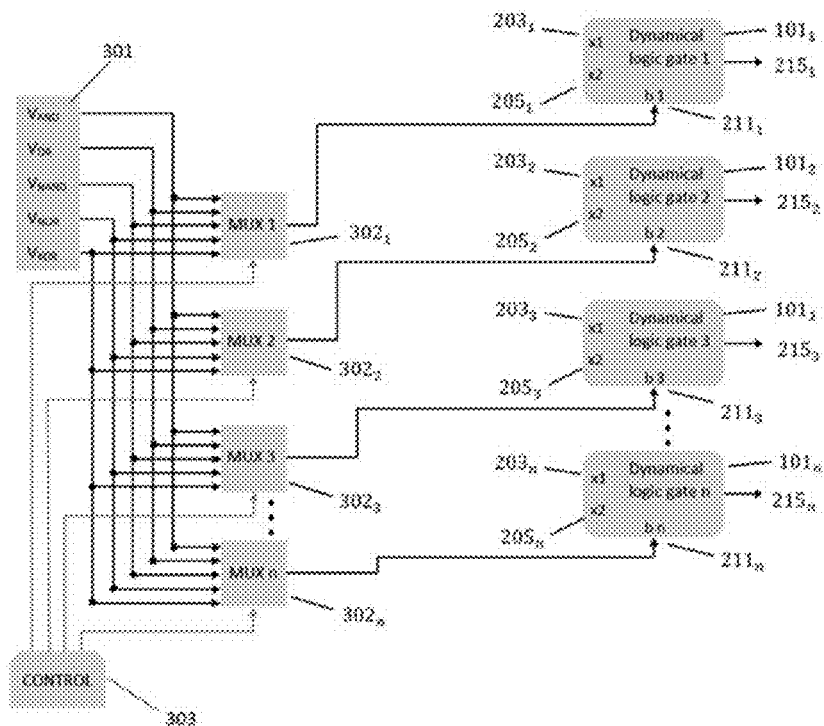
FIG. 3 is a block diagram showing the implementation of the selection of the control parameter for a reconfigurable logic gate within the matrix of reconfigurable logic gates which employs a nonlinear system and an effective programmable rewiring.

An example for implementing reconfigurable circuit logic gate 101 shown in FIG. 2, since it is a detail view of the reconfigurable logic gate 101 consisting of three blocks:
  a) input block 200 of the reconfigurable logic gate 101,
  b) summing block 216, and
  c) output window detector block 217.

Among them, the signal inputs 203 and 205 which enter the reconfigurable logic gate 101 through the input block are appreciated. The input block includes the two comparators 201 and 202 which are connected to each input of the reconfigurable logic gate 101 for receiving the two logic input signals, which are denoted by 203 and 205.

Each reconfigurable logic gate 101 can change their behavior to make a different logic operation when the control parameter 211 is varied; to achieve this purpose voltage values for each logical operation are defined; thus, each reconfigurable logic gate 101 can perform up to five different operations depending on the voltage 211, which is selected according to Table 1.

TABLA 1

Tabla de voltajes definidos correspondientes a cada operación lógica.

| Associated logic operation | $V_{AND}$ | $V_{OR}$ | $V_{XOR}$ | $V_{NAND}$ | $V_{NOR}$ |
|---|---|---|---|---|---|
| Corresponding voltage | −4.0 V | −3.0 V | −2.0 V | −1.0 V | 0.0 V |

The programmable array of field reconfigurable logic gates (FPRGA) 100 consists of a set of reconfigurable logic gates 101, where each $101_i$ can act independently to adjust their own control parameter $211_i$ (Hereinafter, the subscript i ranges from 1 to n).

Embodiment of the "n" Logic Gates.

Reconfigurable logic gates have similar characteristics, so that only the preferred will be described.

Each logic gate reconfigurable 101; has its own control parameter $211_i$, then each of them can perform any of the five logical operations (AND, OR, XOR, NAND, NOR) simply by varying the control parameter $211_i$ according to voltage values shown in Table 1. to achieve this multifunctionality, the five voltage values required are delivered by a voltage source 301; these voltage values to the inputs of at least two analog multiplexers $302_i$ (remember the subscript i ranges from 1 to n) are introduced. To choose the desired output voltage, each analog multiplexer $302_i$ delivers the same number of signals that are identified as control parameters $211_i$, a control word 303 is used to program each analog multiplexers $302_i$; in this embodiment, a control word 303 consists of three bits for each of the analogue multiplexers $302_i$.

A set of experimental responses reconfigurable logic gates 101, shown in FIGS. 4, 5, 6, 7 and 8. For each different logical operations that can be implemented, in the figures we can see that each reconfigurable logic gate 101 has two inputs $x_1$ and $x_2$, which for purposes of description are identified as 203 and 205. If it is considered an array of "n" reconfigurable logic gates 101, each with inputs $x_1$ and $x_2$, then to "n" gates 2n reconfigurable logic inputs are taken. For the interpretation of the signals, the top line is identified as the $x_1$ input (denoted as 203), the middle line corresponds to the input $x_2$ (denoted as 205) and the bottom line (identified as 215) corresponds to the output signal of the reconfigurable logic gate 101.

Using the voltage values defined in Table 1, it can then note that: FIG. 4 if the voltage $V_{AND}$ is used, then the output signal 215 corresponds to the operation AND.

Figure 5:
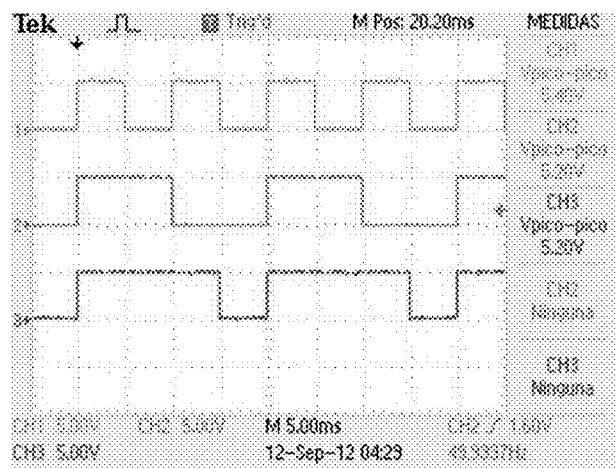
FIG. 5 is the response of a reconfigurable experimental logic gate taking the logical OR within the matrix of reconfigurable logic gates which employs a nonlinear system and an effective programmable rewiring. The upper trace represents the input signal $x_1$. The middle line represents the input signal $x_2$. The bottom line represents the output.

FIG. 5 if the voltage $V_{OR}$ is used, then the output signal 215 corresponds to the operation OR.

Figure 6:
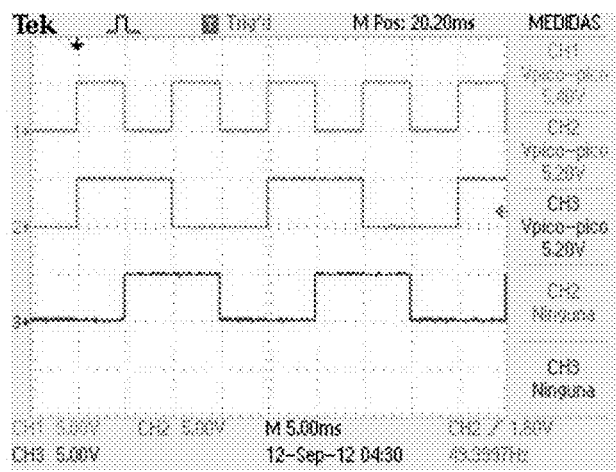
FIG. 6 is the response of a reconfigurable experimental logic gate taking the logical XOR within the matrix of reconfigurable logic gates which employs a nonlinear system and an effective programmable rewiring. The upper trace represents the input signal $x_1$. The middle line represents the input signal $x_2$. The bottom line represents the output.

FIG. 6 if the voltage $V_{XOR}$ is used, then the output signal 215 corresponds to the operation XOR.

Figure 7:
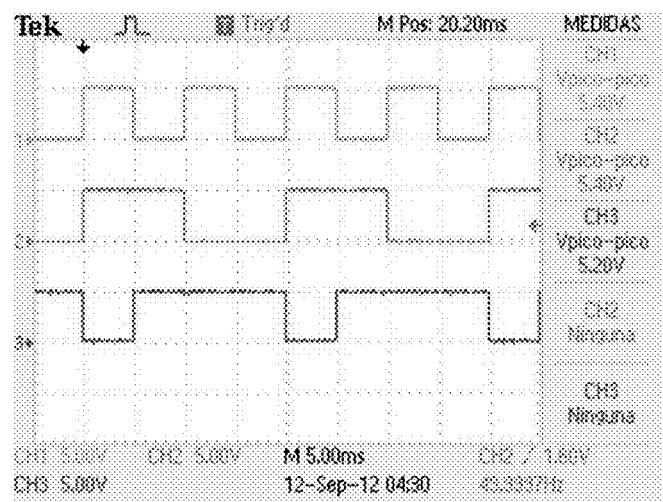
FIG. 7 is the response of a reconfigurable experimental logic gate taking the logical NAND within the matrix of reconfigurable logic gates which employs a nonlinear system and an effective programmable rewiring. The upper trace represents the input signal $x_1$. The middle line represents the input signal $x_2$. The bottom line represents the output.

FIG. 7 if the voltage $V_{NAND}$ is used, then the output signal 215 corresponds to the operation NAND.

Figure 8:
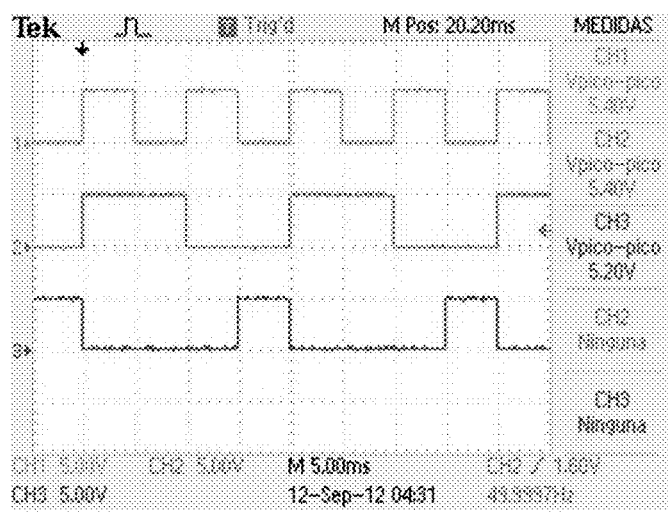
FIG. 8 is the response of a reconfigurable experimental logic gate taking the logical NOR within the matrix of reconfigurable logic gates which employs a nonlinear system and an effective programmable rewiring. The upper trace represents the input signal $x_1$. The middle line represents the input signal $x_2$. The bottom line represents the output.

FIG. 8 if the voltage $V_{NOR}$ is used, then the output signal 215 corresponds to the operation NOR.

Figure 9:
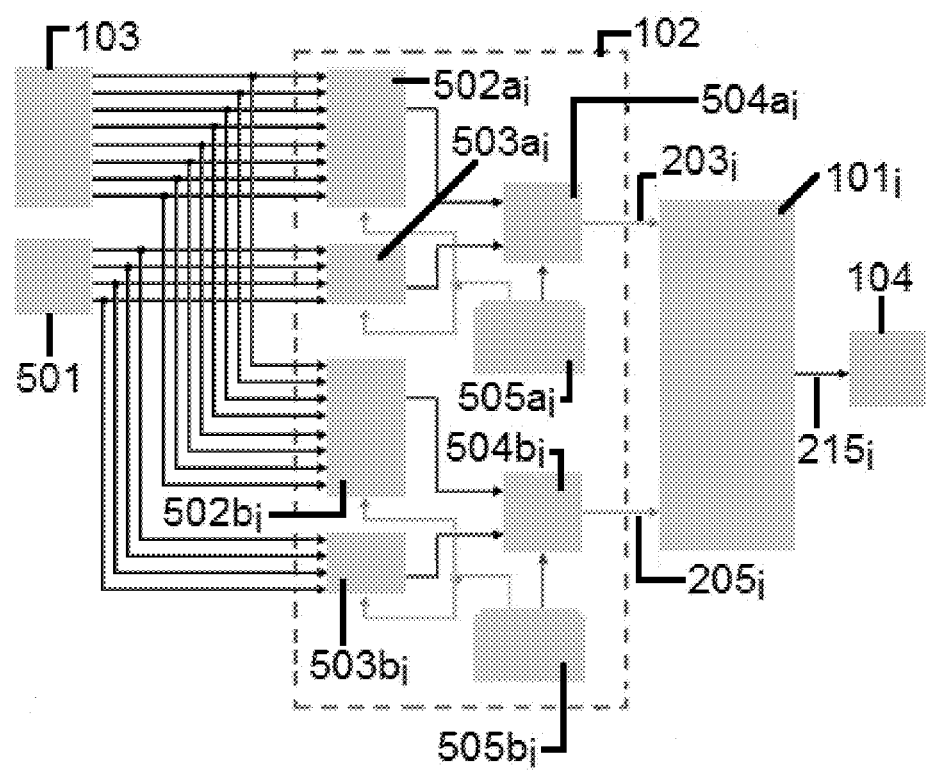
FIG. 9 is a block diagram representing the implementation of programmable rewiring block used in the reconfigurable logic gates matrix employing a nonlinear system and an effective programmable rewiring.

Finally, the rewiring programmable array 102 for field programmable reconfigurable logic gates 100 (FPRGA type) shown in FIG. 9 as a declarative, but not limited choice, below it is presented specifically for one of the reconfigurable logic gates $101_i$, but it should be noted that it can be implemented for n reconfigurable logic gates.

First, the input block 103 receives the total 2n external signals, they pass through at least a first pair of digital multiplexers $502a_i$ and $502b_i$; then a container block 501 stores all n outputs $215_i$ of the n different reconfigurable logic gates $101_i$; the n outputs $215_i$ are connected to at least a second pair of digital multiplexers $503a$; y $503b_i$; then, the outputs of the multiplexers $502a_i$ y $503a_i$ are connected to a fifth digital multiplexer $504a_i$, while the outputs of the multiplexers $502b_i$ y $503b_i$ are connected to a sixth digital multiplexer $504b_i$; a first controller $505a_i$ is used to send a control word of m bits to the multiplexers $502a_i$ y $503a_i$ but also an additional bit is sent to multiplexer $504a_i$; a second controller $505b_i$ is used to send a control word of m bits to the multiplexers $502b_i$ y $503b_i$, but also an additional bit is sent to the multiplexer $504b_i$; the output of the multiplexer $504a_i$ is connected to the input $203_i$ of reconfigurable logic gate $101_i$ and the output of the multiplexer $504b_i$ is connected to the input $205_i$ of the reconfigurable logic gate $101_i$; finally, in order to observe the $215_i$ n outputs of the n reconfigurable logic gates $101_i$, these signals are sent to the output block 104 which provides the user the ability for tracking.

The invention claimed is:

1. A programmable array field matrix of reconfigurable logic gates, the matrix comprising:
    at least two reconfigurable logic gates connected to each other using a programmable rewiring, wherein a plot of each logic gate directs an output of the reconfigurable logic gates to at least one input interface block or towards an output interface block, wherein blocks inlet and outlet are placed on a periphery of the matrix;
    wherein each reconfigurable logic gate of the matrix forming the field programmable reconfigurable logic gates employs a circuit having three blocks:
    a) an input block,
    b) an adder block, and
    c) an output window detector block;
    wherein each reconfigurable logic gate forming the field programmable matrix of reconfigurable logic gates is characterized in that the input block has at least two signal inputs for the operation of the reconfigurable logic gate; and two comparators one for each input of the logic gate, in order to receive two logic signals respectively through inputs; the two logic signals are received, then a decision tree starts where:
    i) If the input signal is greater than the reference voltage, then the output signal of the first comparator is set to a predefined voltage;
    ii) If the input signal is less than the reference voltage, then the output signal of the first comparator is zero volts;
    iii) If the input signal is greater than the reference voltage, then the output signal of the second comparator is set to a predefined voltage;
    iv) If the input signal is less than the reference voltage, then the output signal of the second comparator is zero volts;
    wherein the adder block receives the output signals of the comparators respectively in the input blocks and a compensation signal, the compensation signal is a control parameter for programming of logical operation of the reconfigurable logic gate and gets the different logical operations;
    the output of the adder block is a result of adding the signals from the comparators and the compensation signal, and wherein said sum is performed by an adder in the adder block; and the output window detector block comprises a comparator block defining a logical level at the output as follows:
    d) if the absolute value of the sum obtained by the adder block is less than the window detector block reference; then a "high" logic level is obtained at the output; and
    e) if the absolute value of the sum obtained by the adder block is greater than the window detector block reference; then a logic "low" is obtained at the output.

2. The matrix according to claim 1, wherein the reconfigurable logic gates forming the field programmable matrix of reconfigurable logic gates change their behavior to get a different logical operation when the control parameter is varied by defining voltage values for each logical operation; each reconfigurable logic gate performs up to five different operations in the following list:
    a. AND gate, if the associated voltage is −4.0V
    b. OR gate, if the associated voltage is −3.0V
    c. XOR gate, if the associated voltage is −2.0V
    d. NAND gate, if the associated voltage is −1.0V
    e. NOR gate, if the associated voltage is 0.0V.

3. The matrix according to claim 1, wherein each reconfigurable logic gate forming the field programmable matrix of reconfigurable logic gates has its own control parameter to define their behavior, and each can perform any of the five logical operations by varying the control parameter; characterized in that the five voltage values necessary to achieve the multi-functionality are delivered by a voltage source; the voltage values are introduced to the inputs of at least two analog multiplexers; to choose the desired output of each analog multiplexer that is delivered to the same number of signals that are identified as control parameters, a control word is used to program each voltage analog multiplexer; wherein a control word has three bits for each of the analog multiplexers.

4. The matrix according to claim 3, wherein the programmable rewiring between each of the reconfigurable logic gates is characterized in that the input block receives the total amount of external signals passing at least a first pair of digital multiplexers M1 and M2; then a container block stores all outputs of different reconfigurable logic gates; and these outputs are connected to at least a second pair of multiplexers M3 and M4; then, the output of multiplexer M1 along with the output of multiplexer M3 are connected to a fifth multiplexer M5, while the output of multiplexer M3 together with the output of multiplexer M4 are connected to a sixth multiplexer M6; a first controller is used to send a control word of m bits multiplexers M1 and M3, and also sends an additional bit multiplexer M5; then a second controller is used to send a control word of m bits to the M2 and M4 multiplexers, and also sends an additional bit multiplexer M6; the output of multiplexer M5 is connected to the first input of the reconfigurable logic gate and the output of multiplexer M6 is connected to the second input of reconfigurable logic gate; in order to observe the outputs of the reconfigurable logic gates, these signals are output to the block that provides the user the ability to track.

5. A control system for a matrix as described in claim 3, wherein the reconfigurable logic gates are independent.

6. The control system in accordance with claim 5, wherein a control word is used to control an analog multiplexer where a selectable voltage signal required.

7. The control system according to claim 5, wherein the programmable rewiring between each of the reconfigurable logic gates comprises the input block that receives the total amount of external signals passing at least a first pair of digital multiplexers M1 and M2; then a container block stores all outputs of different reconfigurable logic gates; and these outputs are connected to at least a second pair of multiplexers M3 and M4; then, the output of multiplexer M1 along with the output of multiplexer M3 are connected to a fifth multiplexer M5, while the output of multiplexer M3 together with the output of multiplexer M4 are connected to a sixth multiplexer M6; a first controller is used to send a control word of m bits multiplexers M1 and M3, and also sends an additional bit multiplexer M5; then a second controller is used to send a control word of m bits to the M2 and M4 multiplexers, and also sends an additional bit multiplexer M6; the output of multiplexer M5 is connected to the first input of the reconfigurable logic gate and the output of multiplexer M6 is connected to the second input of reconfigurable logic gate; in order to observe the outputs of the reconfigurable logic gates, these signals are output to the block that provides the user the ability to track, and wherein the reconfigurable logic gates are independent.

8. The control system for programming the rewiring between reconfigurable logic gates in accordance with claim 7, wherein said control system employs at least one pair of control words to control digital multiplexers that define the signals coming to the inputs of the logic gates reconfigurable.

9. A programmable array field matrix of reconfigurable logic gates, the matrix comprising:
at least two reconfigurable logic gates connected to each other using a programmable rewiring, wherein a plot of each logic gate directs an output of the reconfigurable logic gates to at least one input interface block or towards an output interface block, wherein blocks inlet and outlet are placed on a periphery of the matrix;
wherein each reconfigurable logic gate of the matrix forming the field programmable reconfigurable logic gates employs a circuit having three blocks:
a) an input block,
b) an adder block, and
c) an output window detector block;
wherein in order to rewire the outputs of the reconfigurable logic gates at the entrance of the configurable logic gates the input block receives the total amount of external signals passing at least a first pair of digital multiplexers M1 and M2; then a container block stores all outputs of different reconfigurable logic gates; and the outputs are connected to at least a second pair of multiplexers M3 and M4; then, the output of multiplexer M1 along with the output of multiplexer M3 are connected to a fifth multiplexer M5, while the output of multiplexer M3 together with the output of multiplexer M4 are connected to a sixth multiplexer M6; a first controller is used to send a control word of m bits multiplexers M1 and M3, and also sends an additional bit multiplexer M5; then a second controller is used to send a control word of m bits to the M2 and M4 multiplexers, and also sends an additional bit multiplexer M6; the output of multiplexer M5 is connected to the first input of the reconfigurable logic gate and the output of multiplexer M6 is connected to the second input of reconfigurable logic gate; in order to observe the outputs of the reconfigurable logic gates, the signals are output to the block that provides the user the ability to track.

* * * * *